United States Patent
Chen

(10) Patent No.: US 9,048,238 B1
(45) Date of Patent: Jun. 2, 2015

(54) INTEGRATED CIRCUIT DEVICE WITH A CONNECTOR ACCESS REGION AND METHOD FOR MAKING THEREOF

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/076,376

(22) Filed: Nov. 11, 2013

(51) Int. Cl.
*H01L 23/532* (2006.01)
*H01L 23/528* (2006.01)
*H01L 21/768* (2006.01)

(52) U.S. Cl.
CPC .......... *H01L 23/5329* (2013.01); *H01L 23/528* (2013.01); *H01L 21/76895* (2013.01)

(58) Field of Classification Search
USPC .................................................. 257/773–774
See application file for complete search history.

(56) References Cited

U.S. PATENT DOCUMENTS

| | | | |
|---|---|---|---|
| 2012/0181701 A1 | 7/2012 | Chen et al. | |
| 2012/0181702 A1 | 7/2012 | Lee et al. | |
| 2012/0184097 A1 | 7/2012 | Chen et al. | |
| 2013/0126957 A1* | 5/2013 | Higashitani et al. | 257/314 |
| 2013/0270672 A1* | 10/2013 | Lim et al. | 257/532 |
| 2013/0341795 A1* | 12/2013 | Dorhout et al. | 257/773 |
| 2014/0061575 A1* | 3/2014 | Pio | 257/5 |
| 2014/0193969 A1* | 7/2014 | Hull et al. | 438/591 |

FOREIGN PATENT DOCUMENTS

TW      101137311      10/2012

OTHER PUBLICATIONS

U.S. Appl. No. 13/591,372, filed Aug. 22, 2012.
U.S. Appl. No. 13/049,303, filed Mar. 16, 2011.
U.S. Appl. No. 13/114,931, filed May 24, 2011.
English Abstract translation of TW101137311 (Published Oct. 9, 2012).

* cited by examiner

*Primary Examiner* — Mamadou Diallo
(74) *Attorney, Agent, or Firm* — McClure, Qualey & Rodack, LLP

(57) ABSTRACT

An integrated circuit device and a method for making it are provided. The integrated circuit device comprises plural conductive layers, plural dielectric layers and plural first stopping layers. The conductive layers are extending in a first direction. The dielectric layers are paralleled to the conductive layers, and the conductive layers and the dielectric layers are disposed in an alternative arrangement. The first stopping layers are disposed over the conductive layers and the dielectric layers. The first stopping layers make no contact with the conductive layers.

17 Claims, 13 Drawing Sheets

INTEGRATED CIRCUIT DEVICE WITH A CONNECTOR ACCESS REGION AND METHOD FOR MAKING THEREOF

BACKGROUND

1. Technical Field

The disclosure relates in general to an integrated circuit device and method for making such connector access region.

2. Description of the Related Art

Dimensions of integrated circuits continue to become smaller in order to fit more circuitry in a given area. Multilayer integrated circuits have had the width of the electrically conductive layers in a set of parallel electrically conductive layers, as well as the width of the dielectric layers separating the electrically conductive layers, reduced. However, the lateral dimensions or diameters for the interlayer connectors, including plugs and vias, which contact the individual electrically conductive layers, is often large enough so that the possibility of a single interlayer connector contacting two adjacent electrically conductive layers has become a problem. While various schemes have been devised in response to this issue, none are ideal for all circumstances. See, for example, the following co-pending U.S. patent application Ser. No. 13/049,303, filed 16 Mar. 2011, entitled REDUCED NUMBER OF MASK FOR IC DEVICE WITH STACKED CONTACT LEVELS; and Ser. No. 13/114,931, filed 24 May 2011, entitled MULTILAYER CONNECTION STRUCTURE AND MAKING METHOD.

SUMMARY

The disclosure is directed to a connector access region of an integrated circuit device and method for making thereof. The connector access region in the embodiment could prevent short circuit from occurring between adjacent conductive layers. Also, the power consumption and RC delay between adjacent conductive layers of connector access region of the embodiment is relieved.

According to one embodiment, an integrated circuit device is provided. The integrated circuit device comprises plural conductive layer, plural dielectric layers and plural first stopping layers. The conductive layers are extended in a first direction. The dielectric layers are paralleled to the conductive layers, and the conductive layers and the dielectric layers are disposed in an alternative arrangement. The first stopping layers are disposed over the conductive layers and the dielectric layers. The first stopping layers make no contact with the conductive layers According to another embodiment, a method for making integrated circuit device is provided. The method comprises forming a plurality of conductive layers, wherein the conductive layers are spaced apart to each other in an interval and extending in a first direction; forming a plurality of dielectric layers paralleled to the conductive layers, wherein the conductive layers and the dielectric layers are disposed in an alternative arrangement; and forming a plurality of first stopping layers over the conductive layers and the dielectric layers, wherein the first stopping layers make no contact with the conductive layers.

The above and other aspects of the disclosure will become better understood with regard to the following detailed description of the non-limiting embodiment(s). The following description is made with reference to the accompanying drawings.

Figure 1:
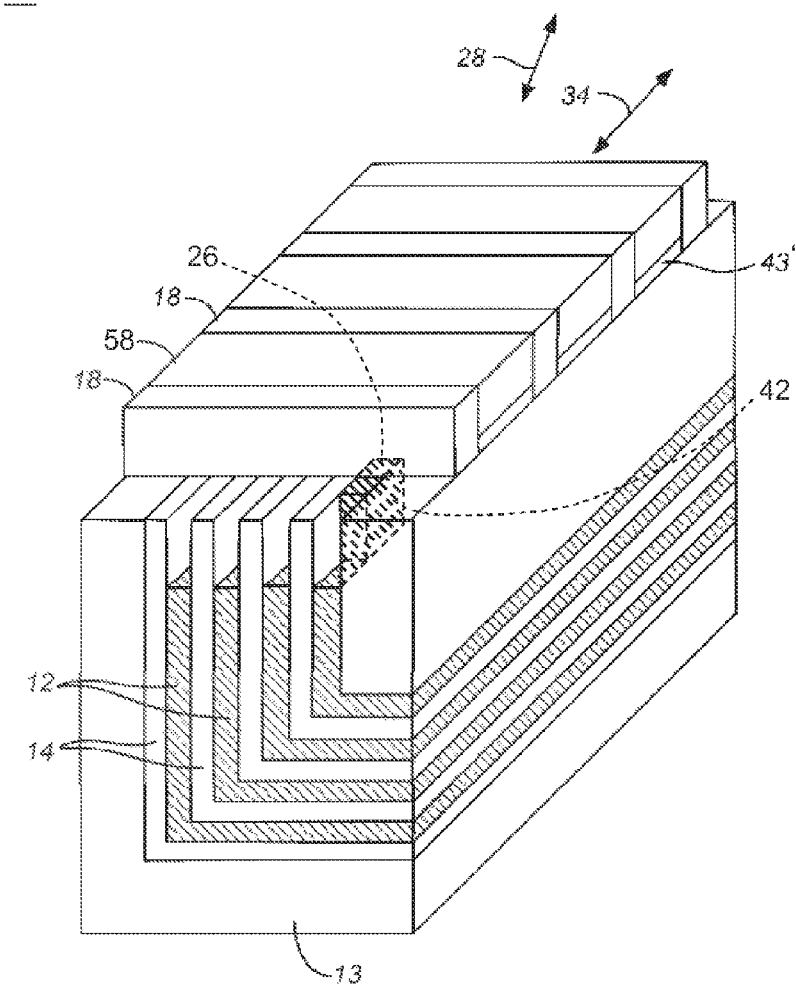
FIG. 1 is a simplified three-dimensional diagram of connector recess region of an integrated circuit device according to one embodiment of disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, it is a simplified three-dimensional diagram of connector recess region of integrated circuit according to the embodiment of present disclosure. The connector recess region 10 comprises a substrate 13 and a plurality of parallel conductive layers 12. The conductive layers 12 are separated by the dielectric layers 14 on the substrate 13. In other word, the conductive layers 12 and the dielectric layers 14 are disposed in an alternative arrangement. A plurality of interlayer connectors 18 are disposed on the conductive layers 12 and the dielectric layers 14, while the interlayer connectors are separated by the isolating layers 58. The conductive layers 12 electrically connected to the interlayer connectors 18 via the extending portions 42 at the contact areas 26.

Figure 1A:
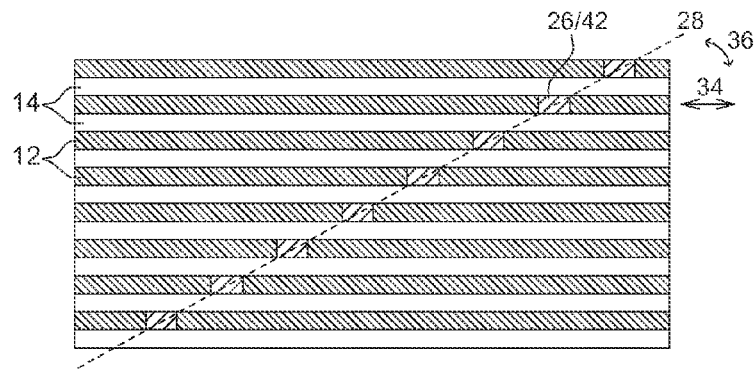
FIG. 1A shows the contact plane of the connector recess region in FIG. 1.

FIG. 1A is a top view of the connector recess region 10 but omitting the interlayer connectors 18, which is contact plane of the connector recess region in FIG. 1. The top surface of each extending portions 42 is a contact area 26, and the contact areas 26 defines a contact plane. The contact areas 26 have rectangular shapes, but the invention is not limited thereto. The contact area can be polygonal shape in other embodiment. The conductive layers are extending in a first direction 34. The contact areas 26 are arranged along a second direction 28. The angle 36 between the first direction 34 and the second direction 28 is larger than zero.

Figure 1B:
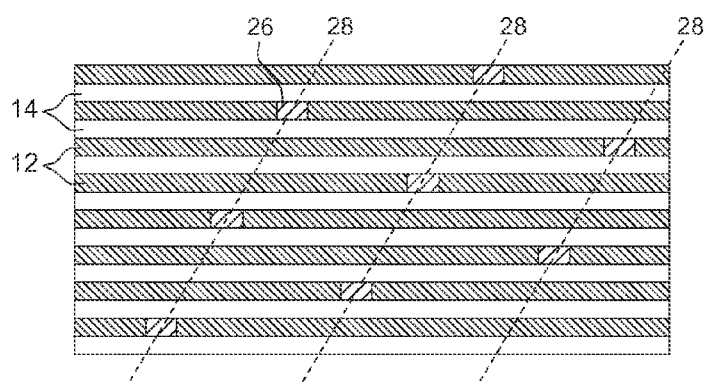
FIG. 1B shows another contact plane according to one embodiment of disclosure.

Beside, the arrangement of the contacts areas 26 may constitute at least one virtual line. Referring to the contact plane in FIG. 1B, the contact areas are arranged along three virtual lines, and the virtual lines are extended along the second direction 28. The design of the rectangular contact areas being along at least one virtual tilt line can keep more room for photo scaling pattern. That is, precise OPC (optical proximity correction) may be performed to enhance the yield rate of the manufacturing process.

FIG. 2 to FIG. 8C show a manufacturing method for the connector recess region 10 in FIG. 1. Figures with integer number label are the top views of the structures. Figure with A label is a cross-sectional view along the cross-sectional line A-A of the structure; similarly, figure with B label is a cross-sectional view along the cross-sectional line B-B of the structure, and figure with C label is a cross-sectional view along the cross-sectional line C-C of the structure.

Figure 2:
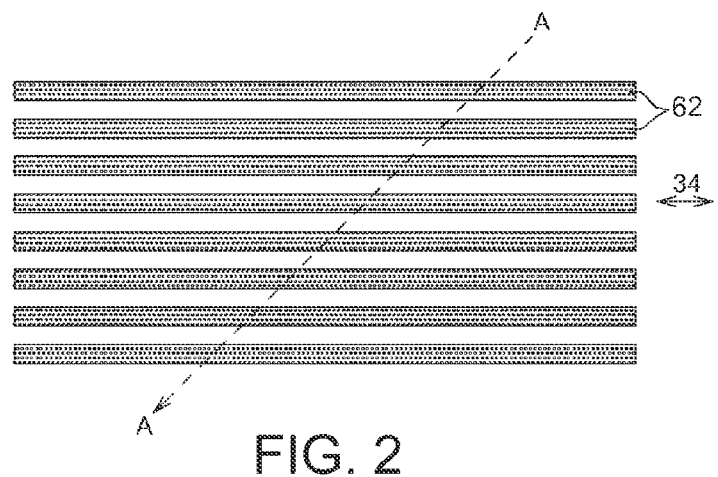
FIGS. 2-8C show a manufacturing method for connector recess region according to one embodiment of disclosure.
Figure 2A:
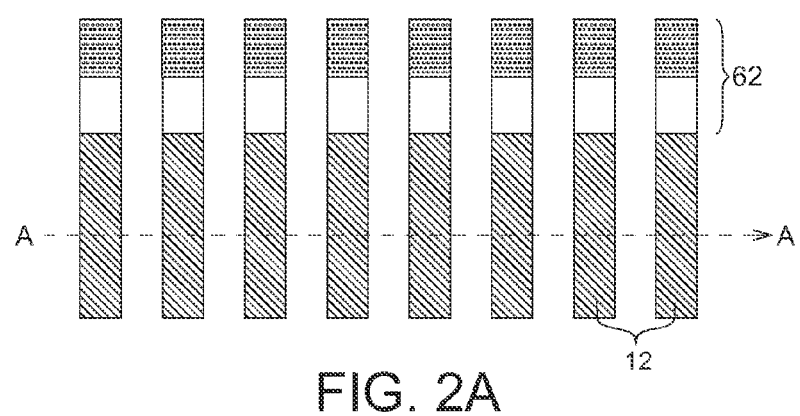

Please refer to FIGS. 2 and 2A, wherein FIG. 2A is a cross-sectional view along the cross-sectional line A-A of FIG. 2. The contact areas 26 will be formed along A-A line in process step described later. First, a plurality of conductive layers 12 are formed via a hard mask layer 62. The hard mask layer 62 may be formed of $SiO_2$ and SiN. The conductive layers are spaced apart with a distance and extending along in a first direction 34. The conductive layers 12 could be used for word line (WL) of memory structure.

Figure 3:
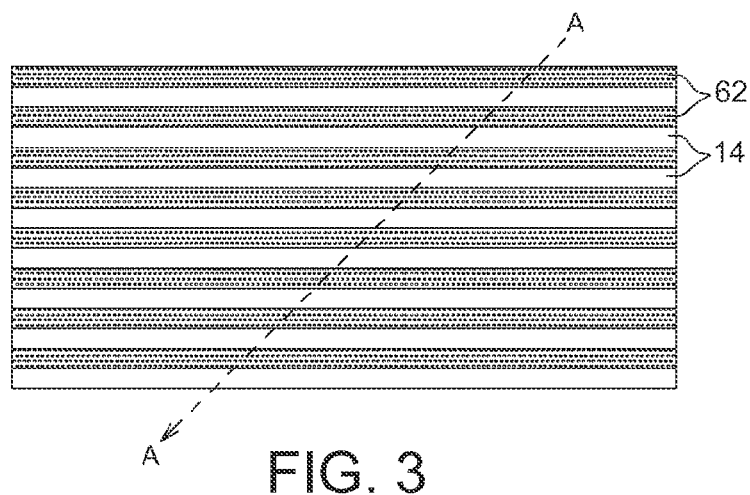
Figure 3A:
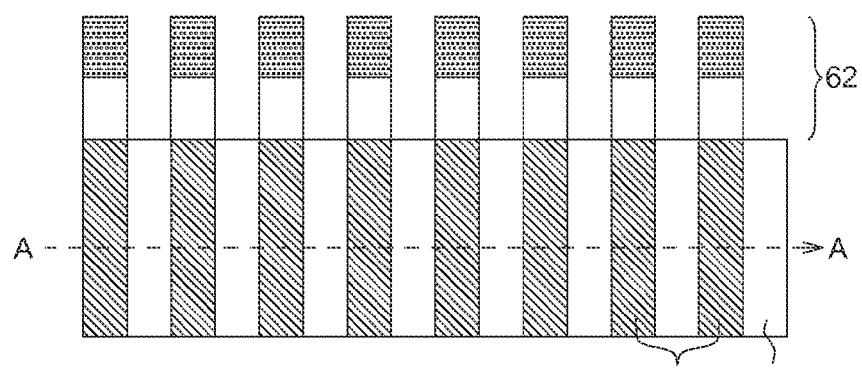

Then, as shown in FIGS. 3 and 3A, a dielectric material (such as $SiO_2$ or other material having lower k value) is deposited to the interval between conductive layers 12. Next, a CMP (chemical mechanical polishing) and/or an etch back process is performed to remove unnecessary part, thereby forming a plurality of dielectric layers 14. The height of dielectric layers 14 is the same or higher than the conductive layers 12. The dielectric layers 14 and the conductive layers 12 are disposed in an alternative arrangement.

Figure 4:
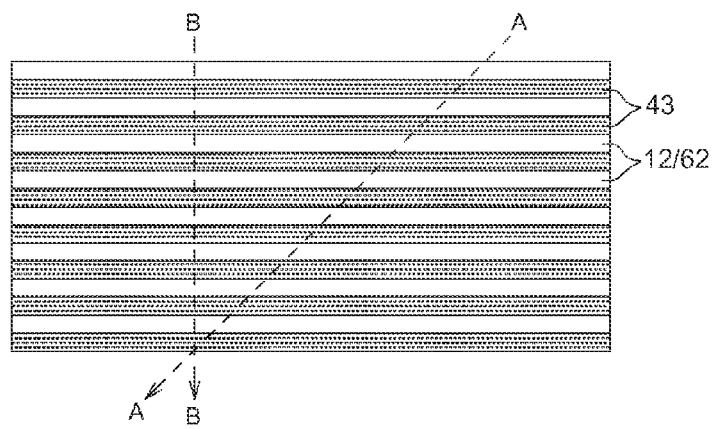
Figure 4A:
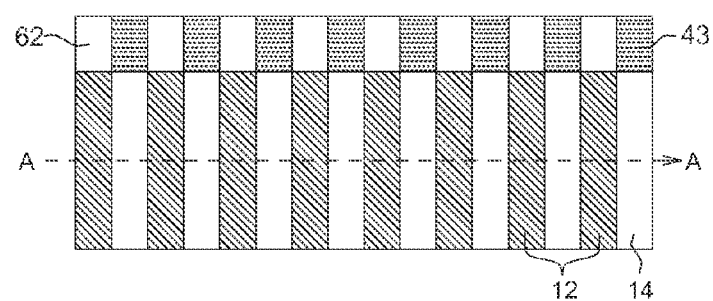

Next, as shown in FIGS. 4 and 4A, an etch stopping material (such as SiN) is deposited to cover the dielectric layer 14 and the hard mask layer 62. Then, a CMP and/or an etch back process is performed to remove unnecessary etch stopping material and SiN in the hard mask layer 62, thereby forming a plurality of first stopping layers 43. In this embodiment, the first stopping layer 43 are positioned above the dielectric layer 14, sitting above the space between two adjacent conductive layers 12, and making no contact with the conductive layers 12. Two lateral sides of the first stopping layer 43 are substantially aligned with the dielectric layers 14, but the present disclosure is not limited thereto. The positions of the first stopping layers 43 are over the dielectric layers 14 and the conductive layers 12. In one embodiment, the first stopping layers 43 are put upon the conductive layers 12, so the conductive layers 12 are separated by the dielectric layers 14. Since the dielectric layers 14 (such as $SiO_2$) have lower k value and larger barrier high than first stopping layers 43 (such as SiN), the capacitance C between adjacent conductive layers 12 is decreased, thereby the power consumption ($E=0.5CV^2$), RC delay (R*C) and leakage current of the connector recess region may be relieved.

Figure 5:
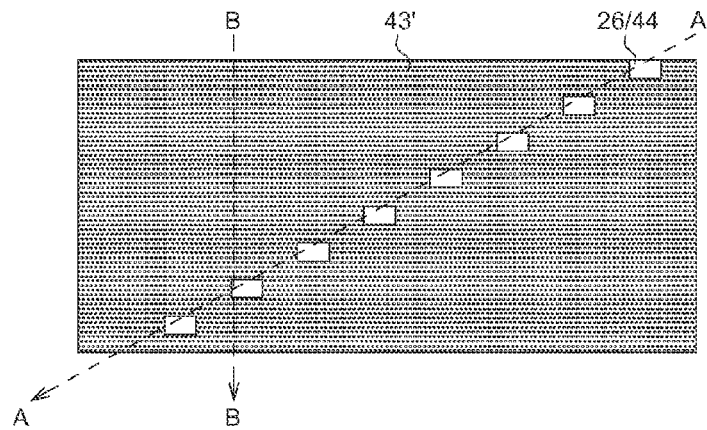
Figure 5A:
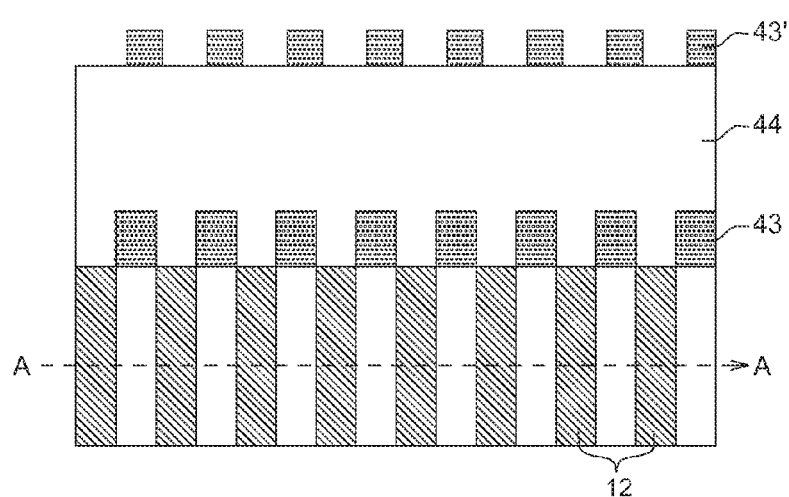
Figure 5B:
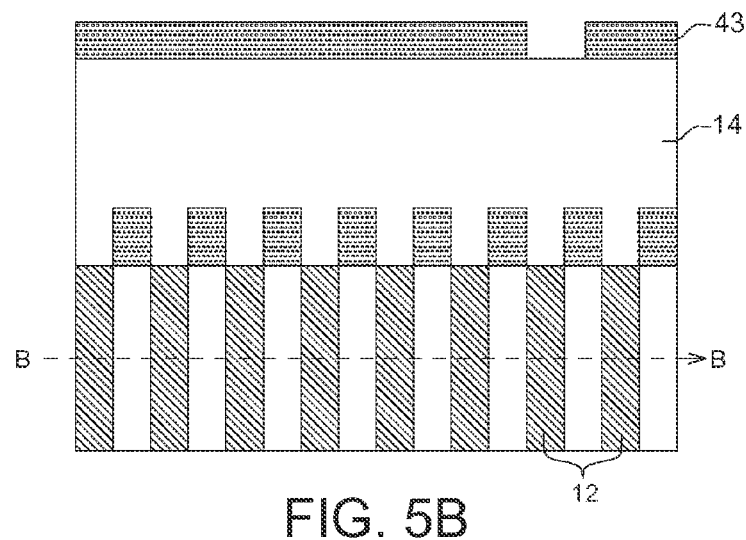

Next, please refer to FIGS. 5, 5A and 5B, wherein FIG. 5B is a cross-sectional view along the cross-sectional line B-B of FIG. 5. A dielectric layer 44 is formed to cover the structure in FIG. 4, and then a second stopping layer 43' is formed to cover the dielectric layer 44. The dielectric layer 44 is formed of an electrically insulating material, which could be the same or different material to the dielectric layer 14. The material of second stopping layer 43' could be the same or different to the first stopping layers. Afterward, using a mask (not shown) to lithograph the second stopping layer to define positions of the contact areas 26. The positions of contact areas 26 expose the dielectric layer 44.

Figure 6:
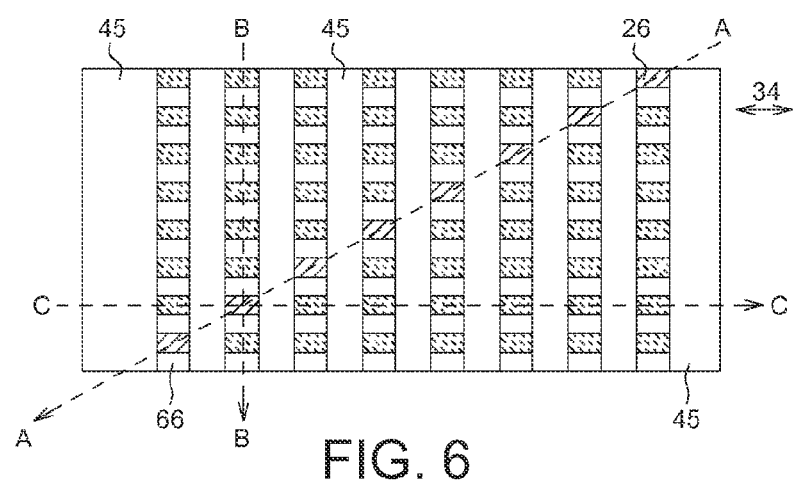
Figure 6A:
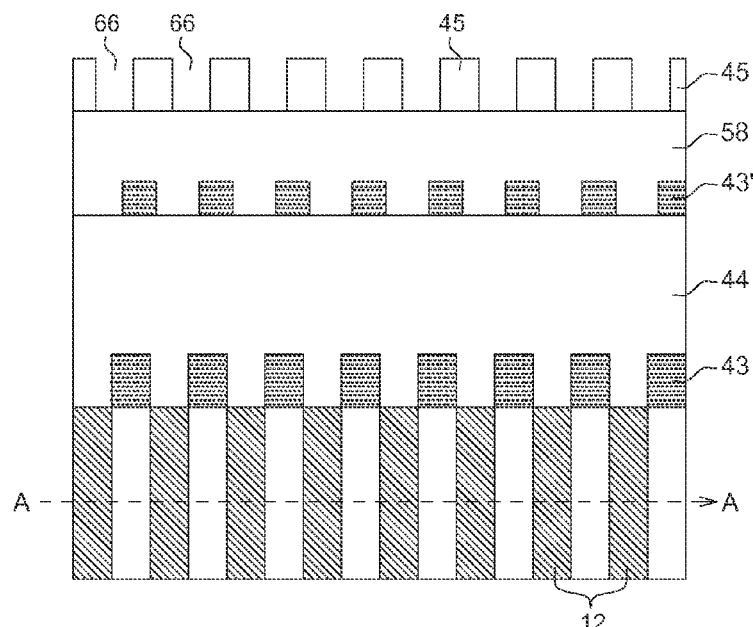
Figure 6B:
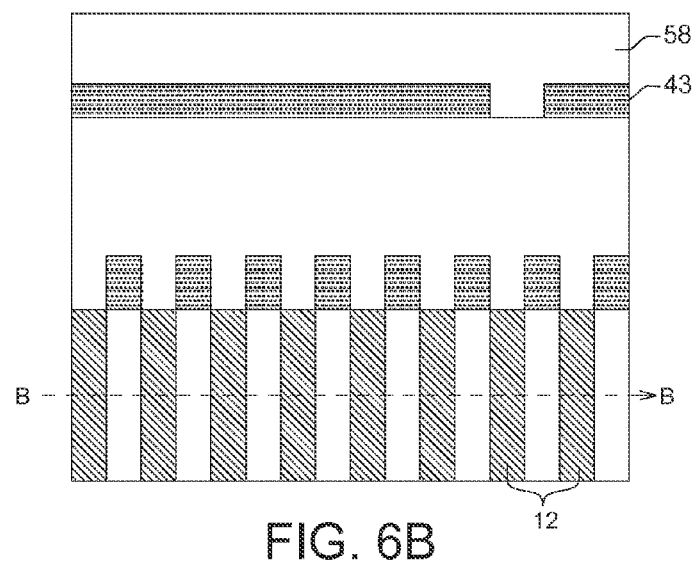
Figure 6C:
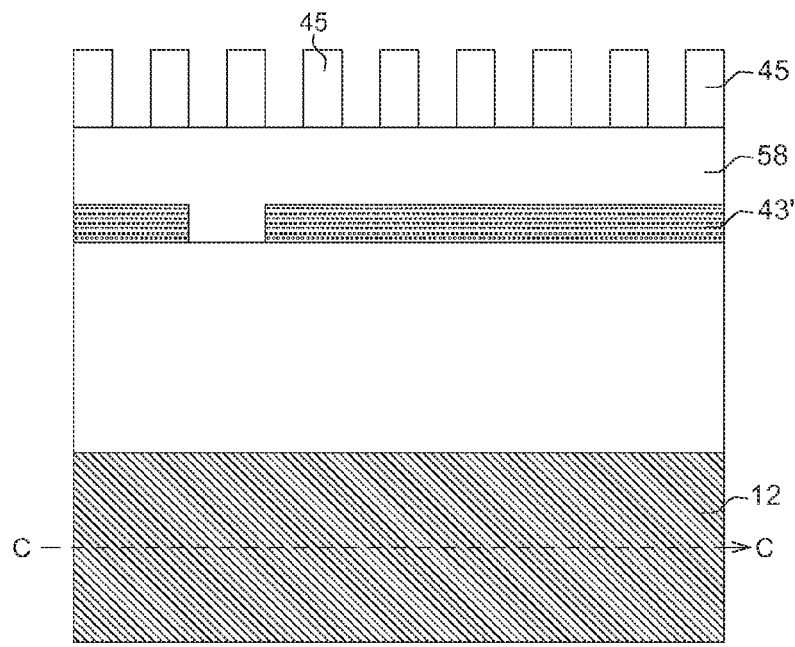
Figure 7:
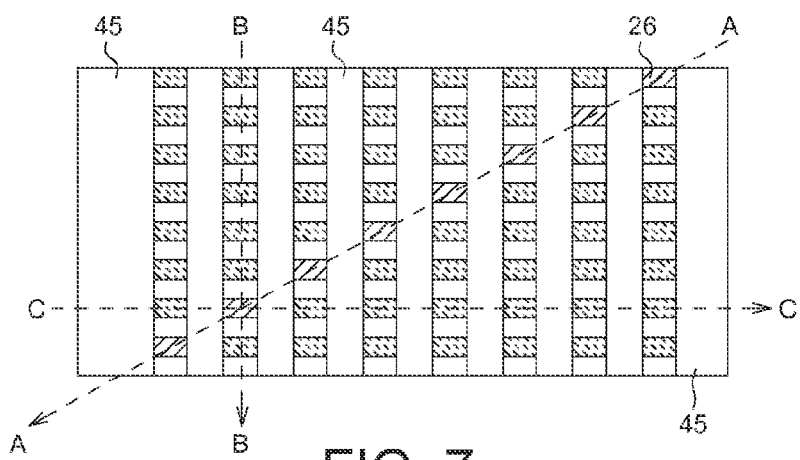
Figure 7A:
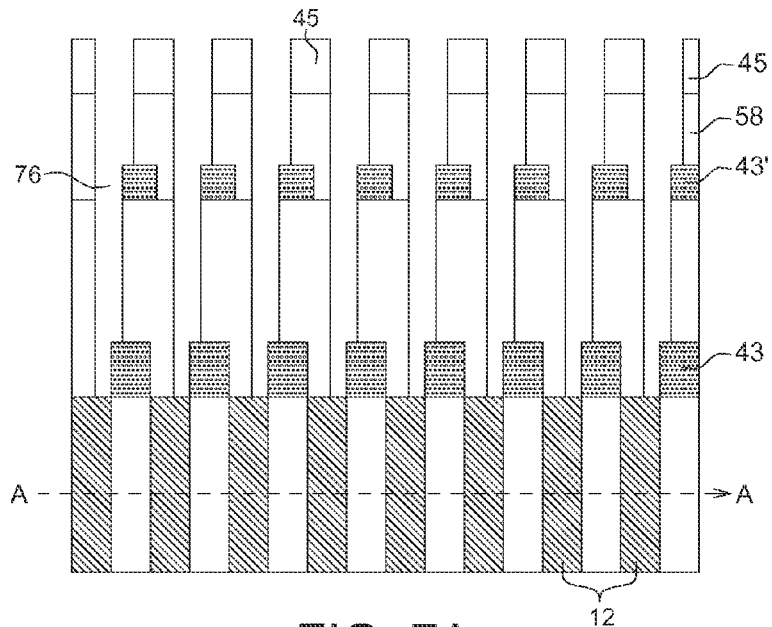
Figure 7B:
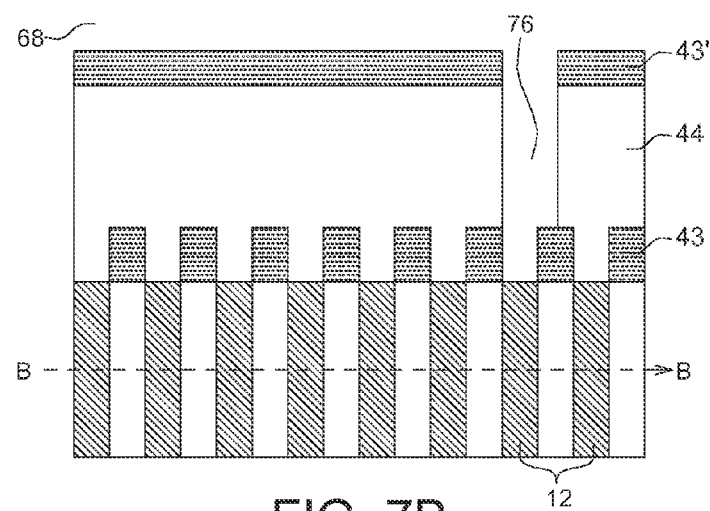
Figure 7C:
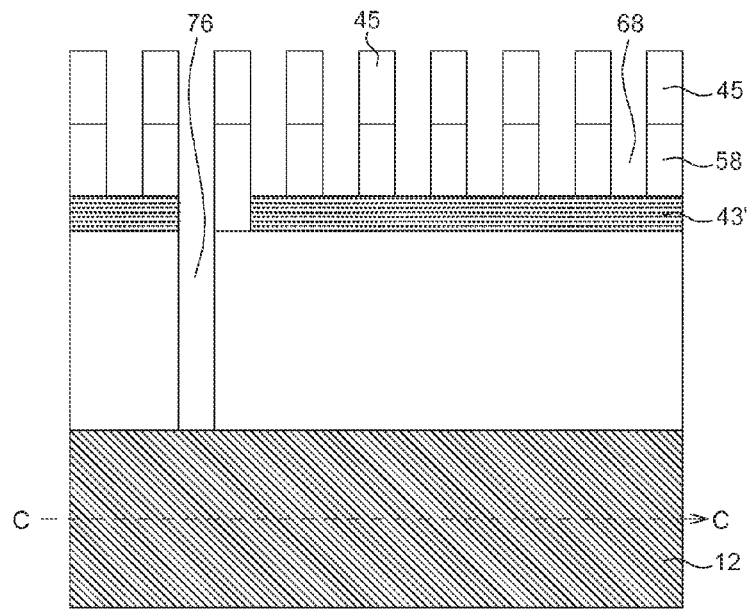
Figure 8:
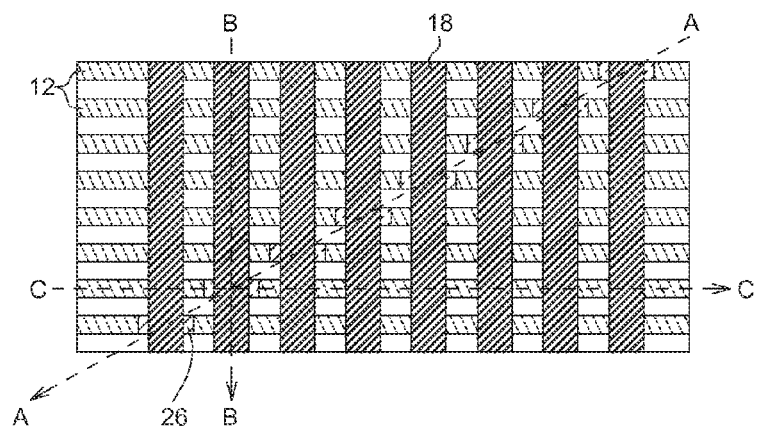
Figure 8A:
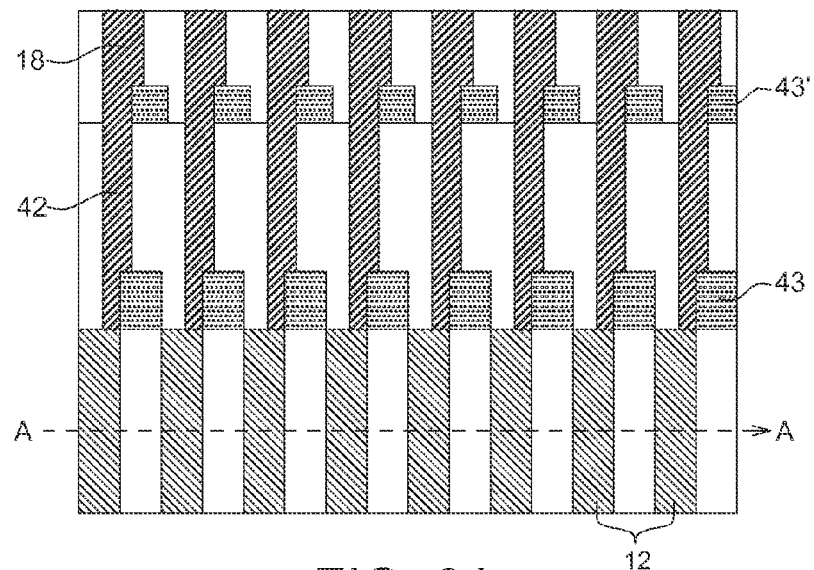
Figure 8B:
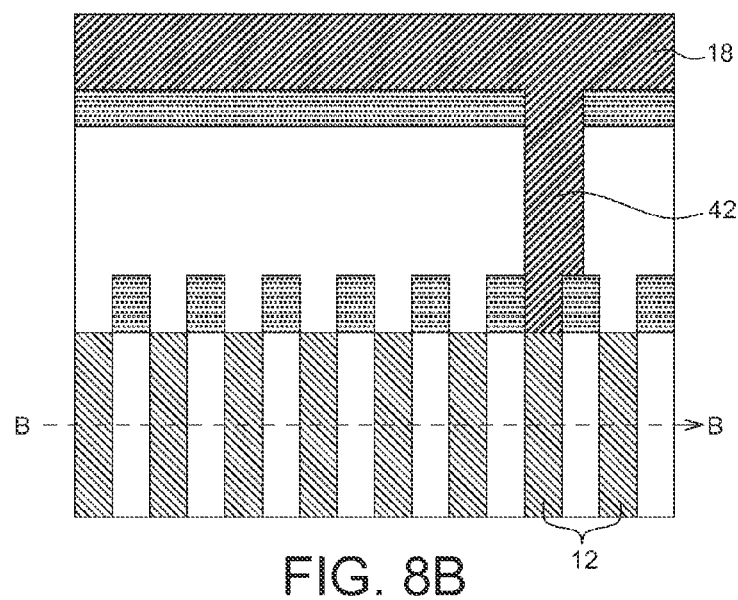
Figure 8C:
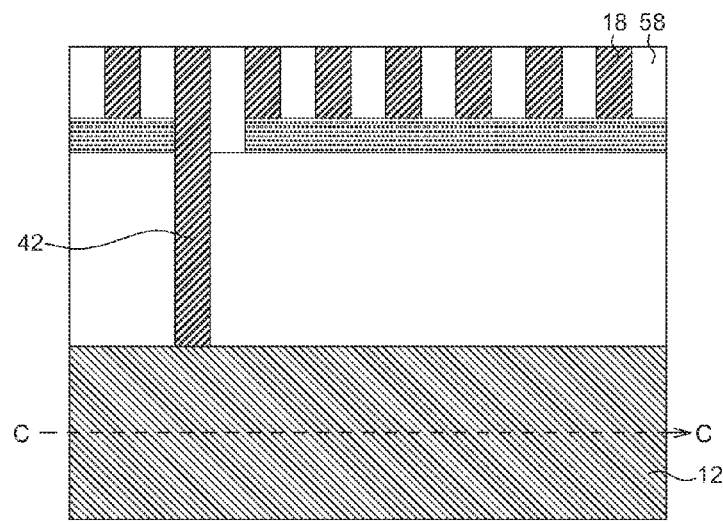

Then, please refer to FIGS. 6, 6A, 6B and 6C, wherein FIG. 6C is a cross-sectional view along the cross-sectional line C-C of FIG. 6. In this step, another oxide is deposited on the second stopping layer 43' and the dielectric layer 44. The oxide is used for being the isolating layer 58, which is the spacer of the interlayer connectors forming in process step described later. Next, a plurality of gaps 66 are formed via patterned photoresist mask 45. The gaps 66 are corresponding to the positions of contact areas 26 and perpendicular to the first direction 34 (the extending direction of conductive layers 12).

Next, as shown in FIGS. 7, 7A, 7B and 7C, the isolating layer 58 are etched along the gaps 66. The etchant may display selectivity between SiN and $SiO_2$, which means the etchant removes $SiO_2$ and leaves the SiN unharmed. That is, most etching process is stopped at the second stopping layer 43' and forming the trenches 68 as shown in FIG. 6C. However, since the second stopping layer 43' at the position of the contact areas 26 is removed early, the etching process at the contact areas 26 will go down and form the openings 76.

Then, as shown in FIGS. 8, 8A, 8B and 8C, a conductive material is deposited in the trenches 68 and the openings 76, thereby forming the extending portions 42 in the openings 76, and forming the interlayer connectors in the trenches 68. At last, the patterned photoresist mask 45 is removed to finished the connector recess region as shown in FIG. 1. In this structure, the conductive layers 12 are electrically connected to the interlayer connectors 18 at the contact areas 26 via the extending portions 42. The conductive layers 12 outside the contact areas are protected by the dielectric layers 44, so as electrically isolated from the interlayer connectors 18. The contact area 26 of each of the conductive layers 12 is disposed along a tilt line (A-A line, second direction 28). This structure could reduce size of the contact areas 26 and prevent short circuit from occurring between adjacent conductive layers 12.

Figure 9:
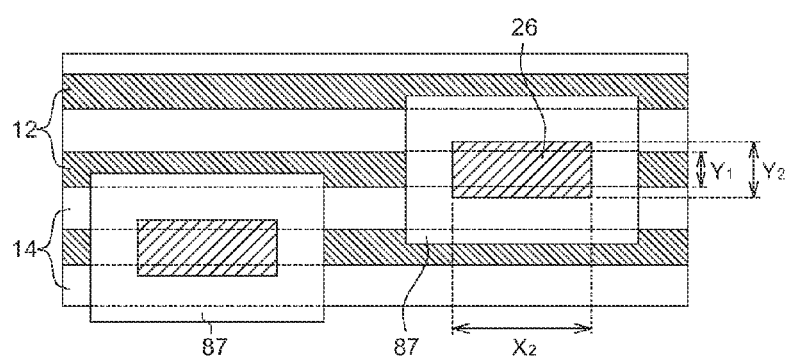
FIG. 9 shows a process of using mask to pattern contact area on contact plane.

Please refer to FIG. 9, it shows a process of using mask to pattern contact area on contact plane (process step in FIG. 5). Because of equipment and process limit, the mask may not exactly align to the conductive layers 12. The width of contact areas 26 ($Y_1$) may not be the same the width of conductive layers 12 ($Y_2$). The width of contact areas could have some flexibility but could not be too large to connect adjacent conductive layers. In one embodiment, when the width of the conductive layers is $Y_2$, the width of the contact areas $Y_1$ is between $Y_2$ to $1.5Y_2$; when the length of the contact areas is $X_2$, the width of the contact areas is between $2X_2$ to $20X_2$.

By tilting the arrangement of the contact areas, the short circuit between adjacent conductive layers could be avoided. That is, the integrated circuit device may be used for connection of high-density wire, especially for wire formed from double patterning process, such as word line and bit line.

There are more room in the nearby regions of the contact areas in the embodiment. That is, the OPC of mask could be more precise, and the litho pattern will much fit the need. Beside, limiting the positions of the contact areas between the interlayer connectors and the conductive layer connector prevents the connector recess region from short circuit. Moreover, since the stopping layer is above the conductive layers (FIG. 4A), the capacitance C between adjacent conductive layers is decreased, so that the power consumption, RC delay and leakage current of the entire connector recess region could be relieved.

It is notable that the connector recess region of the embodiment is not limited to the mutilayer integrated circuit. This design may also be used for regular contact area or interconnection structure with fewer conductive layers.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An integrated circuit device with a connector access region, comprising:

a plurality of conductive layers, wherein the conductive layers are extending in a first direction;

a plurality of dielectric layers, wherein the dielectric layers are paralleled to the conductive layers, and the conductive layers and the dielectric layers are disposed in an alternative arrangement; and a plurality of first stopping layers, wherein the first stopping layers are disposed over the conductive layers and the dielectric layers, and the first stopping layers make no contact with the conductive layers.

2. The integrated circuit device according to claim 1, further comprising:

a plurality of extending portions disposed on and electrically connected to the conductive layers, wherein each top of the extending portions provides a contact area, the contact areas defining a contact plane, the conductive layers extending below the contact plane, the contact areas being arranged along a second direction, and the angle between the first direction and the second direction is larger than zero; and a plurality of interlayer connectors extending above the contact plane, wherein the interlayer connectors electrically connected to the contact areas and electrically isolated from the conductive layers adjacent to the contact areas.

3. The integrated circuit device according to claim 2, further comprising:

an electrically insulating material covering the conductive layers except for the part connected to the extending portions.

4. The integrated circuit device according to claim 3, further comprising:

a second stopping layer disposed between the electrically insulating material and the interlayer connectors.

5. The integrated circuit device according to claim 4, further comprises:

a plurality of isolating layers disposed on the second stopping layer for separating the interlayer connectors.

6. The integrated circuit device according to claim 2, wherein the contact areas have rectangular shape.

7. The integrated circuit device according to claim 2, wherein the arrangement of the contacts areas constitutes at least two virtual lines, and the virtual lines are extended along the second direction.

8. The integrated circuit device according to claim 2, wherein the width of the conductive layers is Y, and the width of the contact areas is between Y to 1.5Y.

9. The integrated circuit device according to claim 2, wherein the length of the contact areas is X, and the width of the contact areas is between 2X to 20X.

10. A method for making an integrated circuit device with a connector access region, comprising:

forming a plurality of conductive layers spaced apart to each other in an interval and extending in a first direction;

forming a plurality of dielectric layers paralleled to the conductive layers, wherein the conductive layers and the dielectric layers are disposed in an alternative arrangement; and forming a plurality of first stopping layers over the conductive layers and the dielectric layers, and the first stopping layers making no contact with the conductive layers.

11. The method according to claim 10, further comprising:

forming a plurality of extending portions, the extending portions disposed on and electrically connected to the conductive layers, wherein each top of the extending portions is a contact area, the contact areas defining a contact plane, the conductive layers extending below the contact plane, the contact areas being arranged along a second direction, and the angle between the first direction and the second direction is larger than zero; and forming a plurality of interlayer connectors extending above the contact plane, wherein the interlayer connectors are electrically connected to the contact areas but electrically isolated from the conductive layers adjacent to the contact areas.

12. The method according to claim 11, wherein before the step of forming extending portions, further comprising:

forming an electrically insulating material covering the conductive layers;

forming a second stopping layer on the electrically insulating material; and etching the second stopping layer and the electrically insulating material to form a plurality of openings, wherein the extending portions are formed in the openings.

13. The method according to claim 12, wherein after the step of forming second stopping layer, further comprising:

forming a plurality of isolating layers on the second stopping layer, the isolating layers spaced apart by trenches, the trenches positioned correspondingly to the contact areas, wherein the interlayer connectors are formed in the trenches.

14. The method according to claim 11, wherein the contact areas have rectangular shape.

15. The method according to claim 11, wherein the arrangement of the contacts areas constitutes at least two virtual lines, and the virtual lines are extended along the second direction.

16. The method according to claim 11, wherein the width of the conductive layers is Y, and the width of the contact areas is between Y to 1.5Y.

17. The method according to claim 11, wherein the length of the contact areas is X, and the width of the contact areas is between 2X to 20X.

* * * * *